United States Patent
Bae et al.

(10) Patent No.: US 10,490,537 B2
(45) Date of Patent: Nov. 26, 2019

(54) LIGHT EMITTING DIODE DEVICE AND METHOD OF MANUFACTURING THE SAME

(71) Applicant: Samsung Display Co., Ltd., Yongin-si, Gyeonggi-do (KR)

(72) Inventors: Su Bin Bae, Hwaseong-si (KR); Yu Gwang Jeong, Anyang-si (KR); Shin Il Choi, Hwaseong-si (KR); Joon Geol Lee, Suwon-si (KR); Sang Gab Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/027,960

(22) Filed: Jul. 5, 2018

(65) Prior Publication Data

US 2019/0172819 A1 Jun. 6, 2019

(30) Foreign Application Priority Data

Dec. 6, 2017 (KR) ........................ 10-2017-0166827

(51) Int. Cl.
| | |
|---|---|
| *H01L 25/16* | (2006.01) |
| *H01L 33/62* | (2010.01) |
| *H01L 33/20* | (2010.01) |
| *H01L 33/44* | (2010.01) |
| *H01L 33/54* | (2010.01) |

(Continued)

(52) U.S. Cl.
CPC ........ *H01L 25/167* (2013.01); *H01L 25/0753* (2013.01); *H01L 33/20* (2013.01); *H01L 33/44* (2013.01); *H01L 33/54* (2013.01); *H01L 33/62* (2013.01); *H01L 27/124* (2013.01); *H01L 2933/005* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 2017/0141154 A1* | 5/2017 | Cha | ........................... F21V 9/14 |
| 2017/0256521 A1* | 9/2017 | Cok | ....................... H01L 25/165 |
| 2017/0287789 A1* | 10/2017 | Bower | .................. H01L 25/167 |

FOREIGN PATENT DOCUMENTS

| | | |
|---|---|---|
| KR | 1994-0006715 B1 | 7/1994 |
| KR | 10-0751126 B1 | 8/2007 |

(Continued)

*Primary Examiner* — Reema Patel
*Assistant Examiner* — Steven M Christopher
(74) *Attorney, Agent, or Firm* — Lewis Roca Rothgerber Christie LLP

(57) ABSTRACT

A light emitting diode device includes a thin film transistor substrate having a plurality of light emitting areas, a first diode electrode and a second diode electrode on the thin film transistor substrate, a first passivation pattern between the first diode electrode and the second diode electrode, a plurality of micro light emitting diodes on the first passivation pattern, a first bridge pattern on the micro light emitting diodes and electrically connecting the first diode electrode to the micro light emitting diodes, and a second bridge pattern on the first bridge pattern and electrically connecting the second diode electrode to the micro light emitting diodes, wherein each sidewall of each of the micro light emitting diodes and each sidewall of the first passivation pattern form a same plane.

13 Claims, 18 Drawing Sheets

(51) Int. Cl.
*H01L 25/075* (2006.01)
*H01L 27/12* (2006.01)

(56) References Cited

FOREIGN PATENT DOCUMENTS

| KR | 10-2018-0055021 | 5/2018 |
| KR | 10-2018-0072909 | 7/2018 |

\* cited by examiner

LIGHT EMITTING DIODE DEVICE AND METHOD OF MANUFACTURING THE SAME

CROSS-REFERENCE TO RELATED APPLICATION

This application claims priority to and the benefit of Korean Patent Application No. 10-2017-0166827, filed on Dec. 6, 2017, which is hereby incorporated by reference in its entirety.

BACKGROUND

1. Field

Aspects of the present inventive concept relate to a device including light emitting diodes and a method of manufacturing the device.

2. Description of the Related Art

A light emitting diode is a device that converts an electrical signal into light, such as infrared light, visible light, etc., by using the characteristics of a compound semiconductor. Light emitting diodes are used in home appliances, remote controls, electric sign boards and various automation devices, and their application range is gradually expanding.

Furthermore, attempts are being made to apply a light emitting diode to a display device. For example, attempts are being made to use a light emitting diode as a backlight of a display device or to implement a self-luminous display device by reducing a light emitting diode to the micro size of a pixel capable of displaying an image.

Accordingly, a structure in which a plurality of light emitting diodes may be integrated is utilized to secure sufficient brightness for use in various types of devices while reducing the size of the light emitting diodes.

However, to miniaturize and then integrate the light emitting diodes, the connection structure between luminous bodies and electrodes or wirings for applying voltages to the luminous bodies should be highly reliable.

SUMMARY

Aspects of embodiments of the present inventive concept are directed to a light emitting diode device having a reliable connection structure between a luminous body and an electrode connected to the luminous body.

Aspects of embodiments of the present inventive concept are also directed to a method of manufacturing a light emitting diode device having a reliable connection structure between a luminous body and an electrode connected to the luminous body.

According to some embodiments of the present inventive concept, there is provided a light emitting diode device including: a thin film transistor substrate having a plurality of light emitting areas; a first diode electrode and a second diode electrode on the thin film transistor substrate; a first passivation pattern between the first diode electrode and the second diode electrode; a plurality of micro light emitting diodes on the first passivation pattern; a first bridge pattern on the micro light emitting diodes and electrically connecting the first diode electrode to the micro light emitting diodes; and a second bridge pattern on the first bridge pattern and electrically connecting the second diode electrode to the micro light emitting diodes, wherein each sidewall of each of the micro light emitting diodes and each sidewall of the first passivation pattern form a same plane.

In some embodiments, each of the micro light emitting diodes includes a light emitting material and a protective layer surrounding the light emitting material and having a cylindrical shape.

In some embodiments, each of the micro light emitting diodes has a cylindrical shape and includes a first sidewall corresponding to a top surface and a second sidewall corresponding to a bottom surface.

In some embodiments, the light emitting material has a structure in which a p-type semiconductor layer, an intermediate layer, and an n-type semiconductor layer are sequentially arranged.

In some embodiments, the first sidewall exposes the p-type semiconductor layer, and the second sidewall exposes the n-type semiconductor layer.

In some embodiments, the first sidewall contacts the first bridge pattern, and the second sidewall contacts the second bridge pattern.

In some embodiments, the light emitting material has an inorganic crystal structure.

In some embodiments, the first bridge pattern extends along a sidewall of each of the micro light emitting diodes and a sidewall of the first passivation pattern.

In some embodiments, the second bridge pattern extends along a sidewall of each of the micro light emitting diodes and a sidewall of the first passivation pattern.

In some embodiments, the first diode electrode and the second diode electrode include fine electrode lines alternately arranged in parallel with each other.

In some embodiments, the first passivation pattern is between the fine electrode lines.

In some embodiments, the micro light emitting diodes is between the fine electrode lines.

In some embodiments, the light emitting diode device further includes barrier ribs on the thin film transistor substrate and under the first diode electrode and the second diode electrode.

According to some embodiments of the present inventive concept, there is provided a method of manufacturing a light emitting diode device, the method including: preparing a thin film transistor substrate; forming a first diode electrode and a second diode electrode on the thin film transistor substrate; forming a first passivation pattern, a micro light emitting diode, and a second passivation pattern between the first diode electrode and the second diode electrode; and forming a first bridge pattern and a second bridge pattern on the first passivation pattern and the micro light emitting diode, wherein the forming of the first passivation pattern, the micro light emitting diode, and the second passivation pattern is performed by a single mask process including two etching processes.

In some embodiments, the forming of the first passivation pattern, the micro light emitting diode, and the second passivation pattern includes: forming a first passivation material layer between the first diode electrode and the second diode electrode; placing the micro light emitting diode on the first passivation material layer; forming a second passivation material layer on the micro light emitting diode; applying a photosensitive material layer onto the second passivation material layer; exposing and developing the photosensitive material layer; etching the first passivation material layer and the second passivation material layer for a first time; and etching the first passivation material layer and the second passivation material layer for a second time.

In some embodiments, the etching of the first passivation material layer and the second passivation material layer for the first time is performed for a longer time than the etching of the first passivation material layer and the second passivation material layer for the second time.

In some embodiments, the etching of the first passivation material layer and the second passivation material layer for the second time is performed using an additive gas including oxygen.

In some embodiments, the etching of the first passivation material layer and the second passivation material layer for the second time is more isotropic than the etching of the first passivation material layer and the second passivation material layer for the first time.

In some embodiments, the etching of the first passivation material layer and the second passivation material layer for the second time is performed using a gas having a higher flow rate than a gas used in the etching of the first passivation material layer and the second passivation material layer for the first time.

In some embodiments, the placing of the micro light emitting diode on the first passivation material layer includes a process of aligning the micro light emitting diode by forming a voltage difference between the first diode electrode and the second diode electrode.

However, aspects of the present inventive concept are not restricted to the ones set forth herein.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
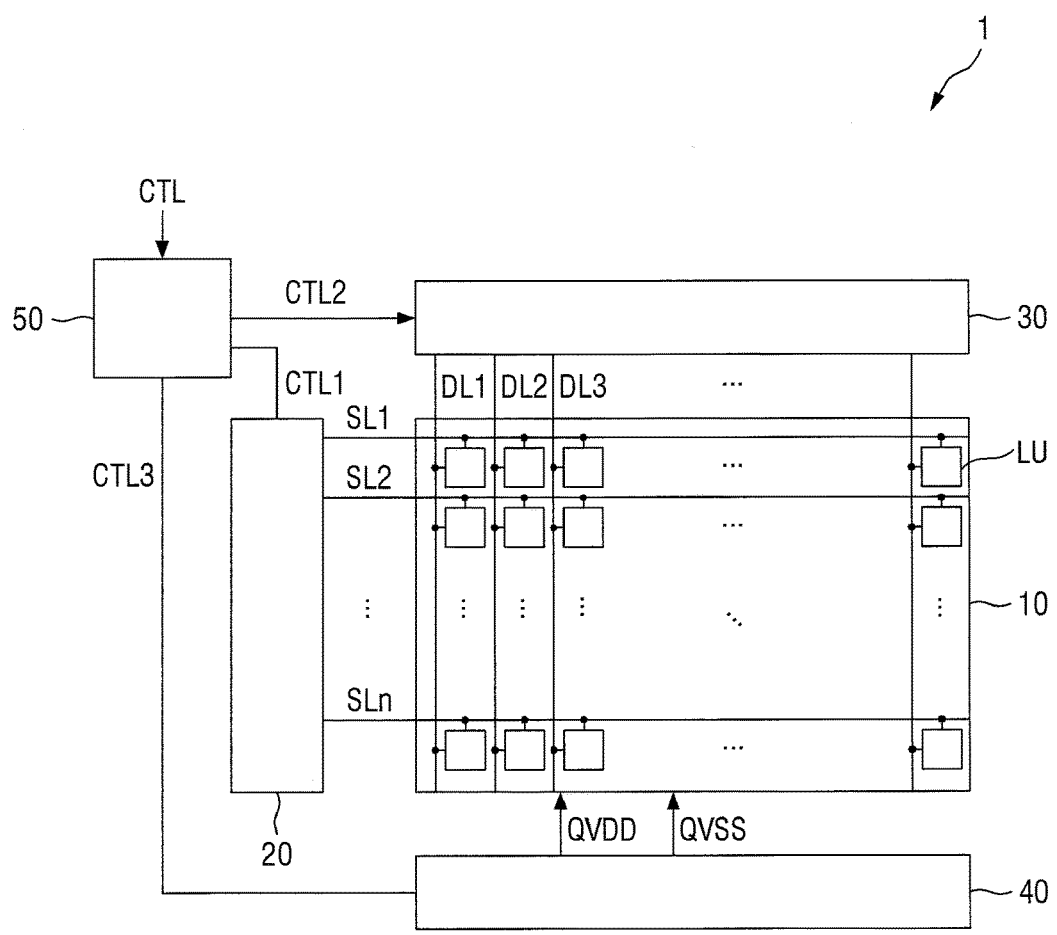
FIG. 1 is a schematic block diagram of a display device according to an embodiment of the present inventive concept.

FIG. 1 is a schematic block diagram of a display device according to an embodiment of the present inventive concept.

Referring to FIG. 1, a light emitting diode device 1 may include a luminescent panel 10 including a plurality of light emitting units (e.g., a plurality of light emitters) LU and a panel driving unit (e.g., a panel driver), which drives the luminescent panel 10.

Here, the light emitting diode device 1 may be a concept including a device for realizing an image as well as a device for providing a pattern of specific light.

The panel driving unit may drive the luminescent panel 10 in, but not limited to, a concurrent (e.g., simultaneous) light emission mode including a non-emission period in which the light emitting units LU do not emit light and a light emission period in which the light emitting units LU simultaneously emit light.

The panel driving unit may include a scan driver 20, a data driver 30, a power supply unit (e.g., a power supply) 40, and a timing controller 50.

The luminescent panel 10 may include the light emitting units LUs to emit light. For example, the luminescent panel 10 may include n×m light emitting units LU located at crossing regions of first through $n^{th}$ (where n is an integer greater than 1) scan lines SL1 through SLn and first through $m^{th}$ (where m is an integer greater than 1) data lines DL1 through DLm, respectively.

The light emitting units LU may be driven in the concurrent (e.g., simultaneous) light emission mode by being connected to first power QVSS and second power QVDD, each having a varying or fixed voltage level within one frame period. The structure and driving method of the light emitting units LU will be described later.

The scan driver 20 may provide scan signals to the light emitting units LU through the first through the $n^{th}$ scan lines SL1 through SLn based on a first control signal CTL1.

The data driver 30 may convert digital image data into analog data signals based on a second control signal CTL2 and provide the data signals to the light emitting units LU through the first through $m^{th}$ data lines DL1 through DLm.

The power supply unit 40 may supply the first power QVSS and the second power QVDD, each having a varying or fixed voltage level within one frame period, to the light emitting units LU based on a third control signal CTL3. For example, the power supply unit 40 may include a DC-DC converter, which generates output voltages having various suitable voltage levels from an input voltage, and switches, which select the output voltages as the voltage levels of the first power QVSS and the second power QVDD based on the third control signal CTL3 in order to set the respective voltage levels of the first power QVSS and the second power QVDD.

The timing controller 50 may control the scan driver 20, the data driver 30, and the power supply unit 40. For example, the timing controller 50 may receive a control signal CTL from an external circuit such as a system board. The timing controller 50 may generate the first through third control signals CTL1 through CTL3 to control the scan driver 20, the data driver 30, and the power supply unit 40, respectively. The first control signal CTL1 for controlling the scan driver 20 may include a scan start signal, a scan clock signal, and the like. The second control signal CTL2 for controlling the data driver 30 may include a horizontal start signal, a load signal, image data, and the like. The third control signal CTL3 for controlling the power supply unit 40 may include a switch control signal for controlling the voltage levels of the first power QVSS and the second power QVDD. The timing controller 50 may generate digital image data corresponding to operation conditions of the luminescent panel 10 based on input image data and provide the digital image data to the data driver 30.

Figure 2:
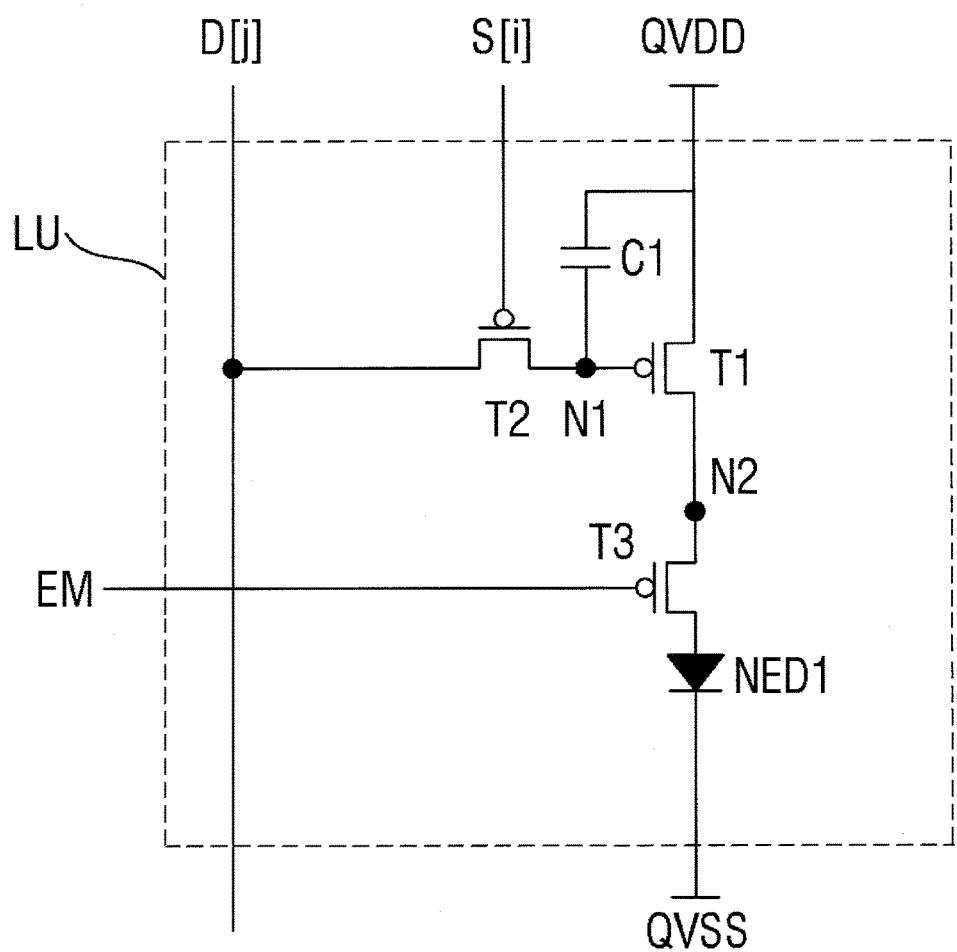
FIG. 2 is an equivalent circuit diagram of one light emitting unit illustrated in FIG. 1.

FIG. 2 is an equivalent circuit diagram of one light emitting unit LU illustrated in FIG. 1.

Referring to FIG. 2, the light emitting unit LU may include a first switching device T1, a second switching device T2, a third switching device T3, and a first capacitor C1. The light emitting unit LU may be located in an $i^{th}$ row and a $j^{th}$ column.

The first switching device T1, the second switching device T2, and the third switching device T3 may be thin film transistors.

In some embodiments, each of the first switching device T1, the second switching device T2, and the third switching device T3 may be an n-channel metal oxide semiconductor (NMOS) transistor. In some embodiments, a p-channel metal oxide semiconductor (PMOS) transistor may be used. For ease of description, the first switching device T1, the second switching device T2, and the third switching device T3 will hereinafter be described as NMOS transistors.

The first switching device T1 may be a driving transistor. In an embodiment, the first switching device T1 may include a first gate electrode connected to a first node N1, a first electrode connected to a second power line to which the second power QVDD is supplied, and a second electrode connected to a second node N2. Here, the second power QVDD may be a driving power source of the light emitting unit LU. Thus, the second power line may be a driving power line.

The second switching device T2 may include a second gate electrode connected to an $i^{th}$ scan line and provided with an $i^{th}$ scan signal S[i], a third electrode connected to the first node N1, and a fourth electrode connected to a $j^{th}$ data line and provided with a $j^{th}$ data signal D[j].

The third switching device T3 may include a third gate electrode connected to an emission control line and provided with an emission control signal EM, a fifth electrode connected to the second node N2, and a sixth electrode connected to a third node N3.

The first capacitor C1 may be located between the second power line, to which the second power QVDD is supplied, and the first node N1. In an embodiment, the first capacitor C1 may include a first capacitive electrode connected to the second power line, to which the second power QVDD is supplied, and a second capacitive electrode connected to the first node N1. In some embodiments, the first capacitor C1 may be a storage capacitor.

A light emitting diode LD may emit light based on a driving current flowing from the first switching device T1. In an embodiment, the light emitting diode LD may include a first device electrode connected to the third node N3 and a second device electrode connected to a first power line. The light emitting diode LD may emit light based on a current flowing from the first device electrode to the second device electrode.

The light emitting diode LD may be composed of a plurality of micro light emitting diodes NLD.

The micro light emitting diodes NLD may be formed by placing a light emitting material having an inorganic crystal structure between two electrodes arranged to face each other and aligning the light emitting material toward a specific polarity by forming an electric field in a specific direction.

Although the circuit diagram of the light emitting unit LU configured using three switching devices and one capacitor is illustrated by way of example in the current embodiment, the inventive concept may not be limited to this example. That is, other switching devices or circuit devices may further be used, or one or more of the above switching devices may be omitted. In some embodiments, the light emitting diodes LD may be controlled in a manner different from the active matrix control mechanism described in the current embodiment.

The specific structure of the light emitting diode LD, according to some embodiments, will now be described.

Figure 3:
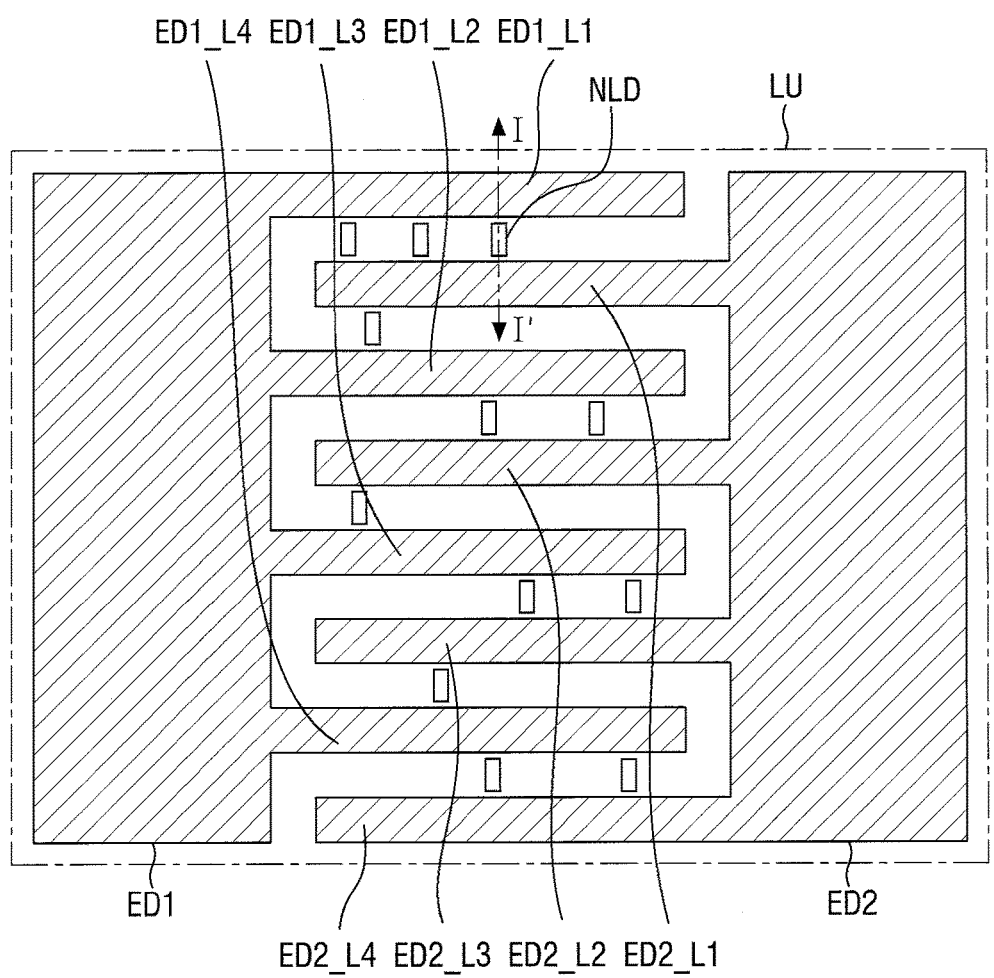
FIG. 3 is a schematic view illustrating the structure of a light emitting diode according to an embodiment of the present inventive concept.
Figure 4:
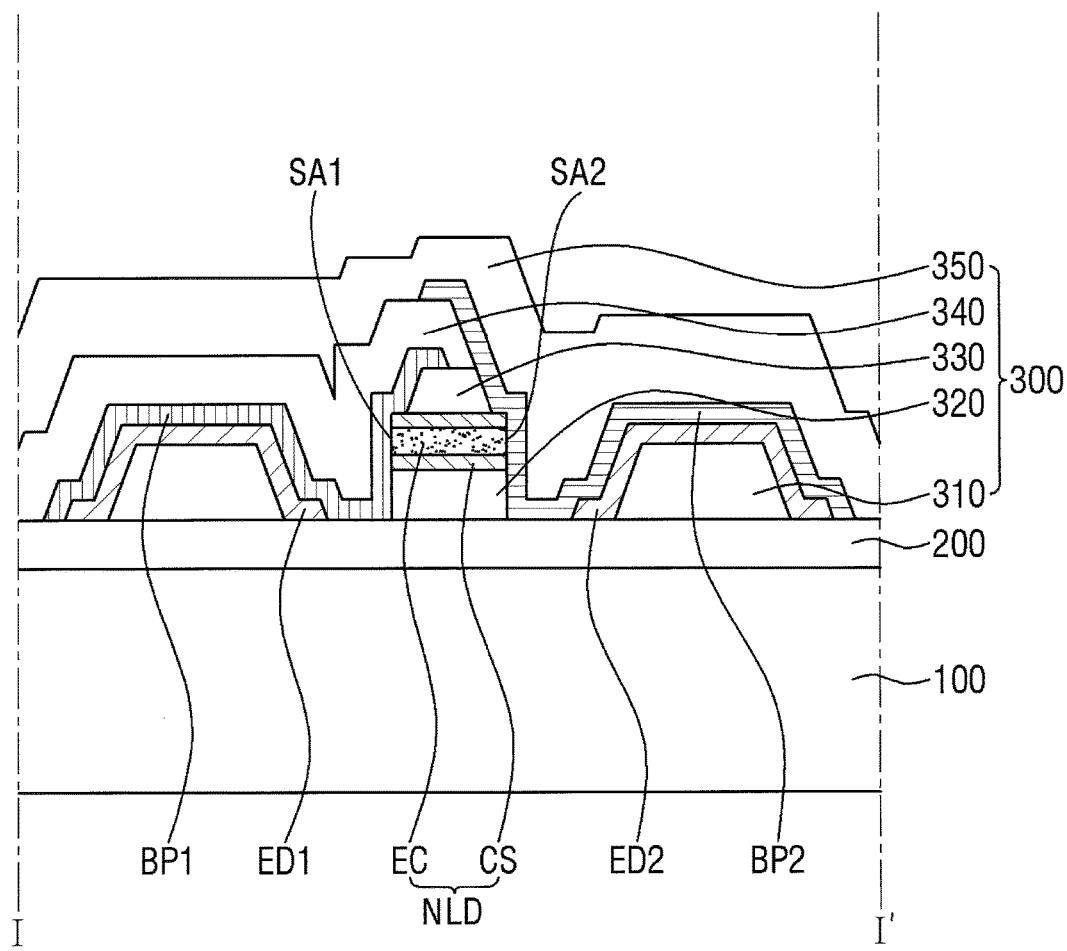
FIG. 4 is a cross-sectional view taken along the line I-I' of FIG. 3.
Figure 5:
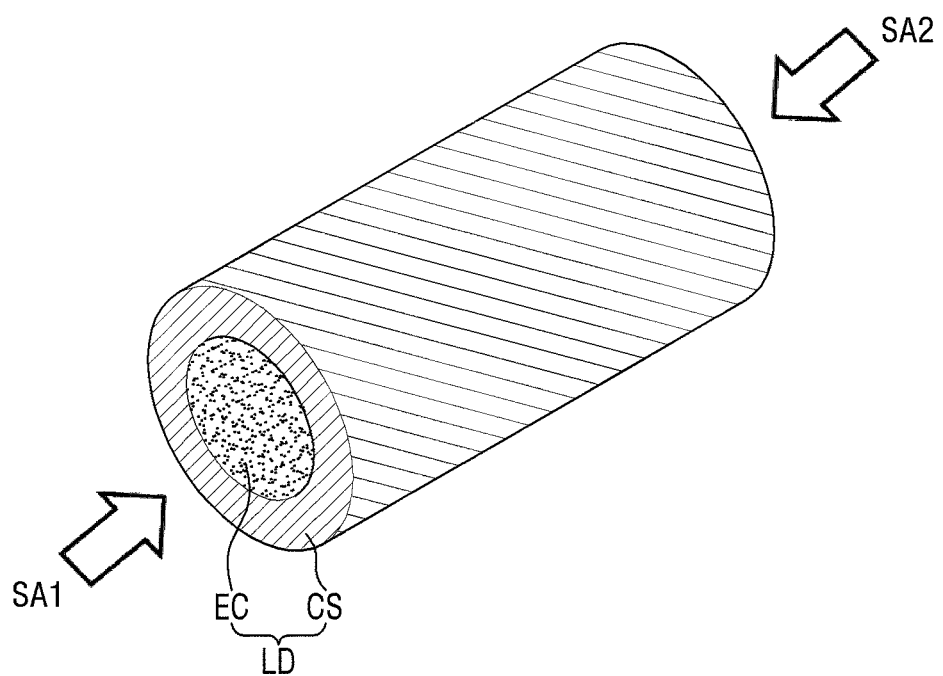
FIG. 5 is a schematic perspective view illustrating the structure of one micro light emitting diode according to an embodiment of the present inventive concept.

FIG. 3 is a schematic view illustrating the structure of a light emitting diode LD according to an embodiment of the present inventive concept. FIG. 4 is a cross-sectional view taken along the line I-I' of FIG. 3. FIG. 5 is a schematic perspective view illustrating the structure of one micro light emitting diode NLD.

FIG. 3 partially illustrates a planar area where a light emitting diode LD is formed in a planar structure of each light emitting unit LU.

Referring to FIGS. 3 through 5, each light emitting unit LU includes a thin film transistor substrate 100, a buffer layer 200, and a light emitting diode layer 300.

The stacked structure of one light emitting unit LU will hereinafter be described.

The thin film transistor substrate 100 may be a substrate having the first, second and third switching devices T1, T2 and T3 described above. In an embodiment, the thin film transistor substrate 100 may consist of a base substrate, a semiconductor layer disposed on the base substrate, and a plurality of metal layers disposed on the semiconductor layer and separated from each other by an insulating layer.

The buffer layer 200 is disposed on the thin film transistor substrate 100.

A top surface of the buffer layer 200 may be substantially flat, so that both electrodes of a light emitting diode LD are disposed on the flat surface. In addition, contact holes may be formed in the buffer layer 200 to connect both electrodes of the light emitting diode LD to the metal layers disposed on the thin film transistor substrate 100 under the buffer layer 200.

Barrier ribs 310 are disposed on the buffer layer 200. Each of a plurality of micro light emitting diodes NLD constituting the light emitting diode LD may be disposed between the barrier ribs 310, and a first diode electrode ED1 and a second diode electrode ED2 disposed along sidewalls of the barrier ribs 310 may be made of a light reflecting material. Therefore, light efficiency may be improved (e.g., increased). However, the present inventive concept is not limited to this case. Although the first diode electrode ED1 and the second diode electrode ED2 to be described later are made of a transparent material, if the barrier ribs 310 are made of a light reflecting material, the light efficiency may still be improved. In addition, although the barrier ribs 310 are overlapped by both the first diode electrode ED1 and the second diode electrode ED2 in the current embodiment, they may also be overlapped only by the first diode electrode ED1 or the second diode electrode ED2.

The first diode electrode ED1 and the second diode electrode ED2 are disposed on the barrier ribs 310. The first diode electrode ED1 may be an anode of the light emitting diode LD, and the second diode electrode ED2 may be a cathode of the light emitting diode LD.

The first diode electrode ED1 and the second diode electrode ED2 may be connected to the metal layers under the buffer layer 200 to receive the first power QVSS and the second power QVDD, respectively.

The first diode electrode ED1 and the second diode electrode ED2 may include fine lines alternately arranged in parallel with each other in an area where the light emitting diode LD is formed. For example, the first diode electrode ED1 may include a plurality of first electrode lines ED1_L1 through ED1_L4 extending in parallel to one another, and the second diode electrode ED2 may include a plurality of second electrode lines ED2_L1 through ED2_L4 extending in parallel to one another. Here, the first electrode lines ED1_L1 through ED1_L4 and the second electrode lines ED2_L1 through ED2_L4 may be alternately arranged in parallel with each other.

The first electrode lines ED1_L1 through ED1_L4 may be electrically connected to each other to receive the same voltage. The second electrode lines ED2_L1 through ED2_L4 may also be electrically connected to each other to receive the same voltage. Here, the voltages applied to the first electrode lines ED1_L1 through ED1_L4 and the second electrode lines ED2_L1 through ED2_L4 may be the first power QVSS and the second power QVDD.

The first diode electrode ED1 and the second diode electrode ED2 may be made of one or more of the metals including molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), copper (Cu), and the like, or may be made of various conductive materials including oxides and conductive polymers.

A first passivation pattern 320 is disposed on the first diode electrode ED1 and the second diode electrode ED2. In a manufacturing process, the first passivation pattern 320 may keep each of the micro light emitting diodes NLD constituting the light emitting diode LD separated from the first diode electrode ED1 and the second diode electrode ED2 by a certain distance.

The first passivation pattern 320 may be made of an inorganic insulating material and disposed between the first diode electrode ED1 and the second diode electrode ED2 facing each other.

In addition, in an area where each of the micro light emitting diodes NLD is disposed, sidewalls of the first passivation pattern 320 may lie on the same line with a first sidewall SA1 and a second sidewall SA2 of the micro light emitting diode NLD.

The micro light emitting diodes NLD is disposed on the first passivation pattern 320. The micro light emitting diodes NLD controlled by a pair of the first diode electrode ED1 and the second diode electrode ED2 constitute one light emitting diode LD.

Each of the micro light emitting diodes NLD may be disposed on the first passivation pattern 320 and may be disposed between the first diode electrode ED1 and the second diode electrode ED2 in plan view (see, e.g., FIG. 3).

Each of the micro light emitting diodes NLD includes a light emitting material EC and a protective layer CS.

The light emitting material EC may have an inorganic crystal structure and may be formed in a cylindrical shape surrounded by the protective layer CS. When an electric current flows, the light emitting material EC may emit light of a set or predetermined wavelength belonging to a wavelength region ranging from ultraviolet light to visible light.

The light emitting material EC may have a structure in which a p-type semiconductor layer, an intermediate layer, and an n-type semiconductor layer are sequentially arranged.

Here, the p-type semiconductor layer may be selected from semiconductor materials having a composition formula of $In_xAl_yGa_{1-x-y}N$ (where $0 \leq x \leq 1$, $0 \leq y \leq 1$, $0 \leq x+y \leq 1$), such as GaN, AlN, AlGaN, InGaN, InN, InAlGaN, AlInN, or the like. In addition, the p-type semiconductor layer may include a p-type dopant such as Mg, Zn, Ca, Sr, Ba, and/or the like.

The intermediate layer is an area where electrons and holes are recombined. As the electrons and the holes are recombined, the intermediate layer may transition to a low energy level and generate light having a wavelength corresponding to the low energy level. The intermediate layer may be made of a semiconductor material having a composition formula of $In_xAl_yGa_{1-x-y}N$ (where $0 \leq x \leq 1$, $0 \leq y \leq 1$, $0 \leq x+y \leq 1$). In addition, the intermediate layer may be formed in a single quantum well (SQW) structure or a multi-quantum well (MQW) structure. The intermediate layer may also include a quantum wire structure or a quantum dot structure.

The protective layer CS may cover side surfaces of the light emitting material EC formed in a cylindrical shape, protect the light emitting material EC disposed inside the protective layer CS, and maintain the shape of the light emitting material EC. In addition, the protective layer CS may prevent the light emitting material EC from being electrically connected to an unintended component. Thus, the protective layer CS may be made of an insulating material.

Because the protective layer CS covers curved sidewalls of the cylindrical light emitting material EC, the circular first sidewall SA1 of the light emitting material EC and the circular second sidewall SA2 disposed opposite the first sidewall SA1 may be exposed. In other words, each of the micro light emitting diodes NLD may have a cylindrical shape, and a bottom surface (or a top surface) of the micro light emitting diode NLD may correspond to the first sidewall SA1, and the top surface (or the bottom surface) of the micro light emitting diode NLD may correspond to the second sidewall SA2.

Here, because the p-type semiconductor layer, the intermediate layer, and the n-type semiconductor layer constituting the light emitting material EC are sequentially arranged, each of the first sidewall SA1 and the second sidewall SA2 may correspond to any one of the p-type semiconductor layer and the n-type semiconductor layer. That is, the light emitting material EC may have a structure surrounded by the protective layer CS, wherein the first sidewall SA1 may expose the p-type semiconductor layer (or the n-type semiconductor layer), and the second sidewall SA2 may expose the n-type semiconductor layer (or the p-type semiconductor layer).

A second passivation pattern 330 is disposed on the micro light emitting diodes NLD. The second passivation pattern 330 may prevent or substantially prevent a first bridge pattern BP1 disposed on the second passivation pattern 330 from being electrically connected to a component other than the first diode electrode ED1 and the first sidewall SA1 of each of the micro light emitting diodes NLD. The second passivation pattern 330 may be made of an inorganic insulating material.

The first bridge pattern BP1 is disposed on the second passivation pattern 330. The first bridge pattern BP1 may serve as a passage through which the first diode electrode ED1 and each of the micro light emitting diodes NLD may be electrically connected to each other.

As described above, the first sidewall SA1 or the second sidewall SA2 of each of the micro light emitting diodes NLD may form the same plane with each sidewall of the first passivation pattern 320 disposed under the micro light emitting diode NLD. In other words, the first sidewall SA1 or the second sidewall SA2 of each of the micro light emitting diodes NLD and each sidewall of the first passivation pattern 320 disposed under the micro light emitting diode NLD may form one substantially continuous sidewall.

In this case, because the first sidewall SA1 of each of the micro light emitting diodes NLD and a sidewall of the first passivation pattern 320 form substantially the same plane, a step formed on the first bridge pattern BP1 disposed along the first sidewall SA1 of the micro light emitting diode NLD and the sidewall of the first passivation pattern 320 disposed under the micro light emitting diode NLD may be reduced in size or minimized, thereby reducing or minimizing the breaking of the first bridge pattern BP1.

The first bridge pattern BP1 may be made of a transparent conductive material. However, if a path through which light emitted from each of the micro light emitting diodes NLD is directed upward is sufficiently secured, the first bridge pattern BP1 may be made of an opaque metal material.

A third passivation layer 340 is disposed on the first bridge pattern BP1. The third passivation layer 340 may insulate the first bridge pattern BP1 and a second bridge pattern BP2 from each other and may be made of an inorganic insulating material.

The second bridge pattern BP2 is formed on the third passivation layer 340. The second bridge pattern BP2 may serve as a passage through which the second diode electrode ED2 and each of the micro light emitting diodes NLD may be electrically connected to each other.

As described above, because the second sidewall SA2 of each of the micro light emitting diodes NLD and a sidewall of the first passivation pattern 320 disposed under the micro light emitting diode NLD form substantially the same plane, a step formed on the second bridge pattern BP2 disposed along the second sidewall SA2 of the micro light emitting diode NLD and the sidewall of the first passivation pattern 320 disposed under the micro light emitting diode NLD may be reduced or minimized, thereby reducing or minimizing the breaking of the second bridge pattern BP2.

The second bridge pattern BP2 may be made of a transparent conductive material. However, if a path through which light emitted from each of the micro light emitting diodes NLD is directed upward is sufficiently secured, the second bridge pattern BP2 may be made of an opaque metal material.

A fourth passivation layer 350 is disposed on the second bridge pattern BP2. The fourth passivation layer 350 may protect components disposed under the fourth passivation layer 350 from the outside. In some embodiments, the fourth passivation layer 350 may be omitted.

Hereinafter, a method of manufacturing the light emitting diode LD according to the embodiment of FIGS. 3 through 5 will be described in detail.

FIGS. 6 through 18 are views illustrating a process of manufacturing the light emitting diode LD according to the embodiment of FIGS. 3 through 5.

In FIGS. 6 through 18, cross sections cut along the line I-I' of FIG. 3 are illustrated in order of process.

Figure 6:
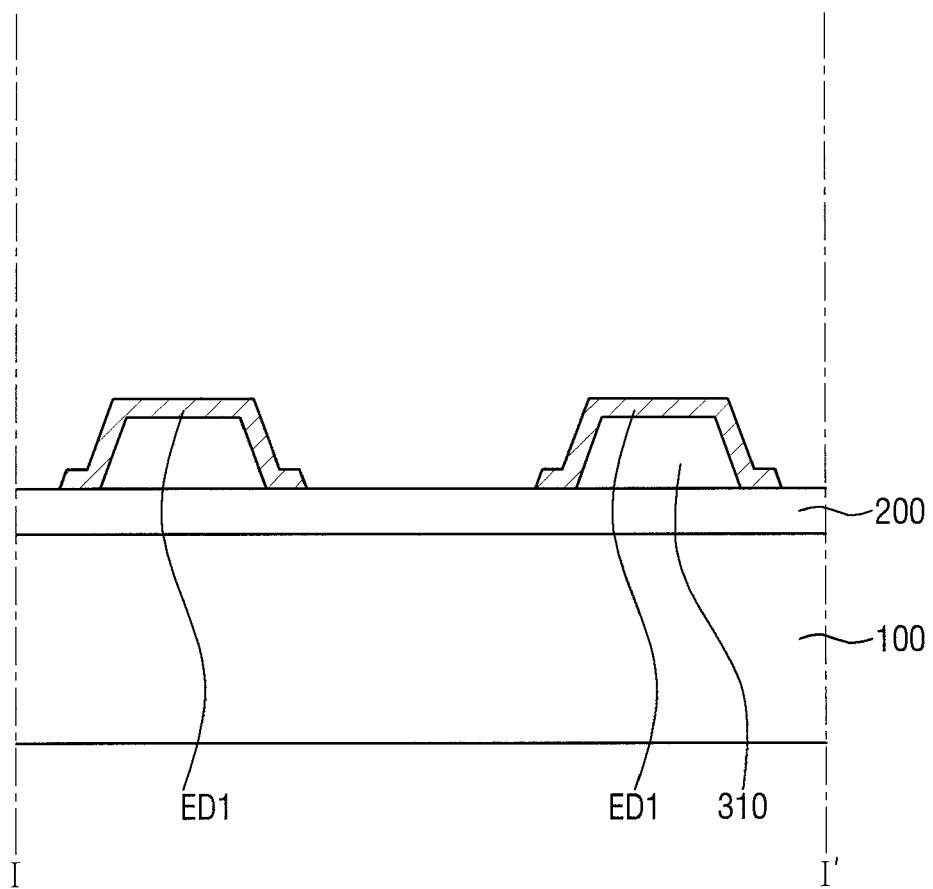
FIGS. 6-18 are views illustrating a process of manufacturing the light emitting diode according to the embodiment of FIGS. 3-5.

First, referring to FIG. 6, a thin film transistor substrate 100 is manufactured, and a buffer layer 200 is stacked on the thin film transistor substrate 100. Then, barrier ribs 310 are formed on the buffer layer 200. Next, a first diode electrode ED1 and a second diode electrode ED2 are formed on the barrier ribs 310.

Here, the barrier ribs 310 may be formed by one mask process, and the first diode electrode ED1 and the second diode electrode ED2 may be formed by another mask process. However, the present inventive concept is not limited to this case, and the barrier ribs 310, the first diode electrode ED1 and the second diode electrode ED2 may also be formed by one mask process, depending on their structure.

As used herein, a mask process refers to a series of processes including at least some of a process of forming a material layer for forming desired patterns, a process of applying a photosensitive material onto the material layer, a process of exposing the photosensitive material to light by using a mask for blocking light in some areas of the photosensitive material, a process of partially removing (i.e., developing) the material layer according to exposure patterns, a process of partially removing (i.e., etching) the exposed material layer for forming the desired patterns, and a process of removing the remaining photosensitive material.

Even if some of the above processes are omitted, the remaining processes may be defined as one mask process as long as they include the process of exposing the photosensitive material to light by using the mask for blocking light. For example, when a pattern to be manufactured is made of a photosensitive material, a desired pattern made of a photosensitive material may be formed by three processes of applying a photosensitive material, exposing the photosensitive material to light, and developing the photosensitive material, which may also be defined as a one mask process.

Figure 7:
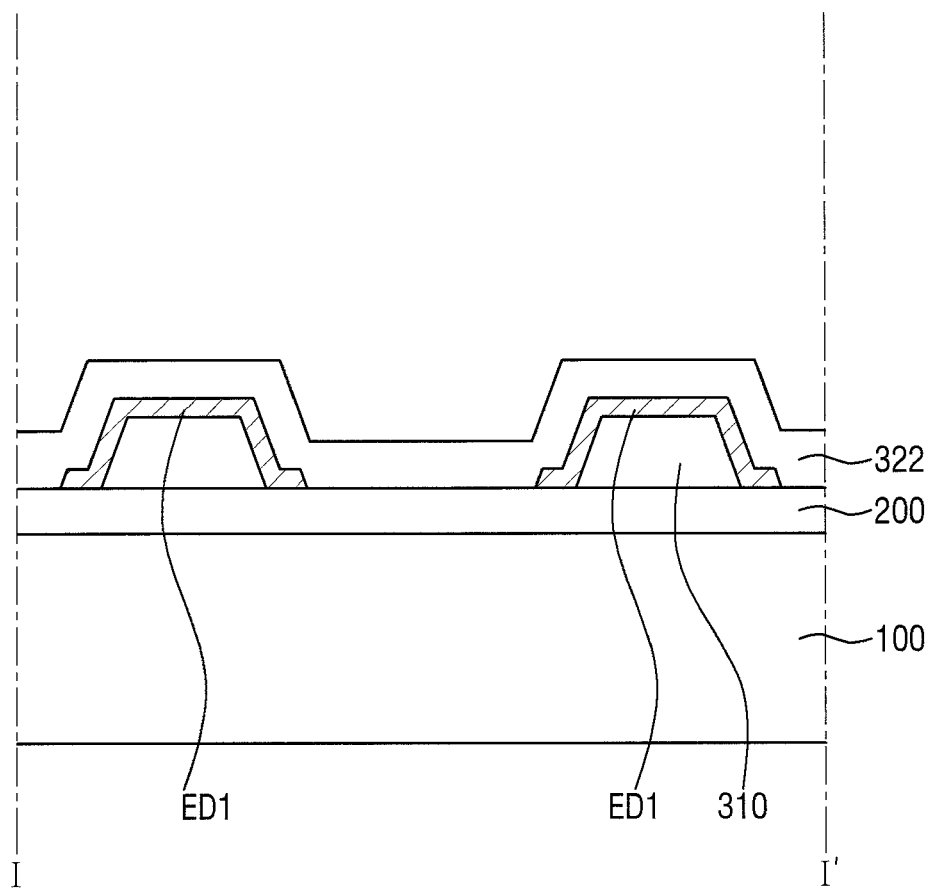

Next, referring to FIG. 7, a first passivation material layer 322 is formed on the first diode electrode ED1 and the second diode electrode ED2.

Figure 8:
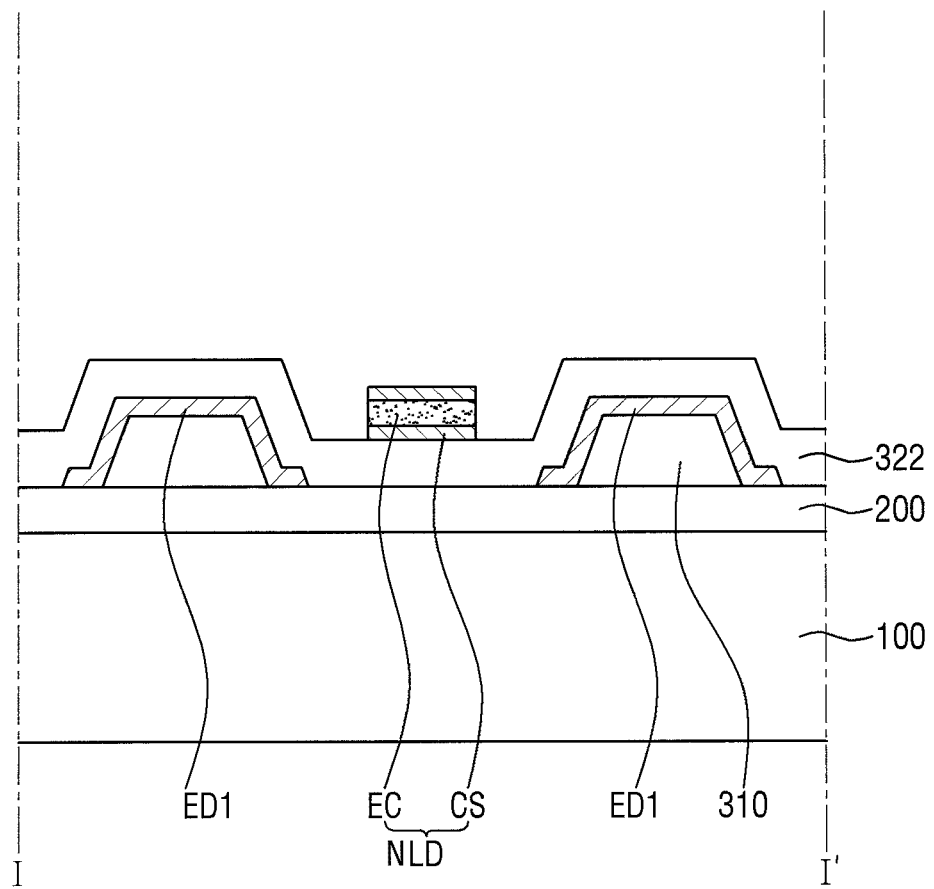

Next, referring to FIG. 8, a plurality of micro light emitting diodes NLD are placed on the first passivation material layer 322, and a voltage is applied to the first diode electrode ED1 and the second diode electrode ED2 to align the micro light emitting diodes NLD in the same direction. Here, the micro light emitting diodes NLD may be mixed with a special solution and then sprayed onto the first passivation material layer 322. Then, the special solution may be naturally dried or removed to leave the micro light emitting diodes NLD on the first passivation material layer 322.

Each of the micro light emitting diodes NLD may be spaced apart from the first diode electrode ED1 and the second diode electrode ED2 by a set or predetermined distance due to steps formed on the first passivation material layer 322. In other words, each of the micro light emitting diodes NLD may be positioned between the first diode electrode ED1 and the second diode electrode ED2 by the steps formed at the first passivation material layer 322.

Figure 9:
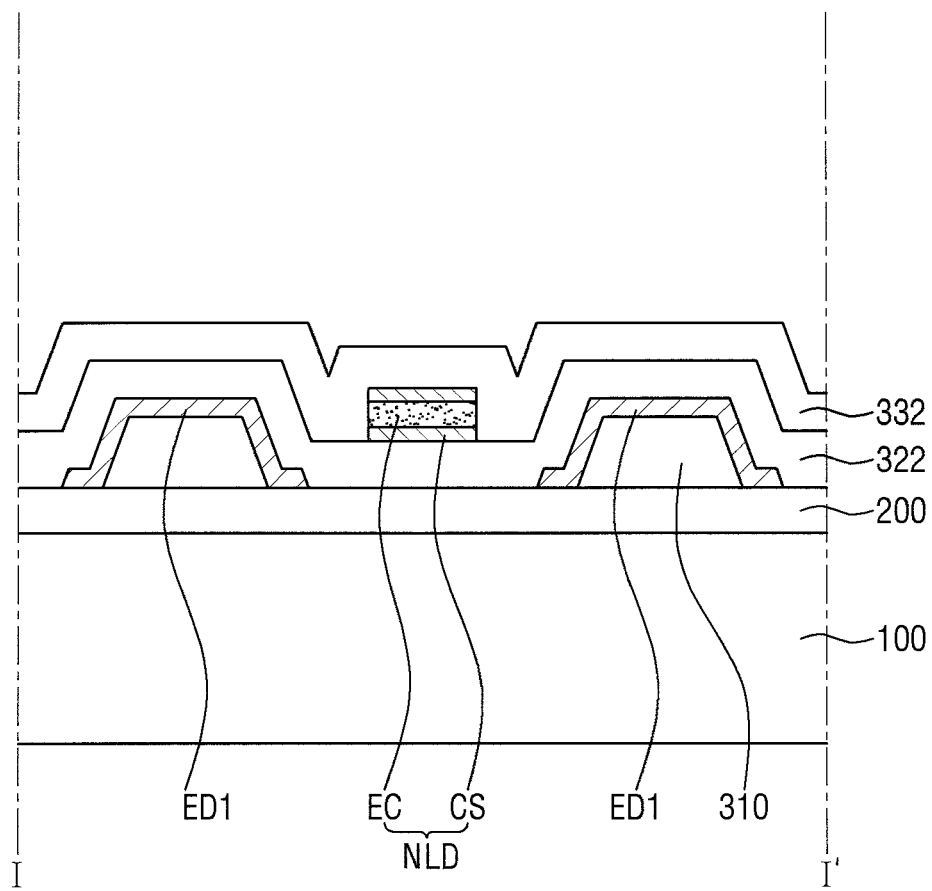

Next, referring to FIG. 9, a second passivation material layer 332 is formed on the first passivation material layer 322 and the micro light emitting diodes NLD.

Figure 10:
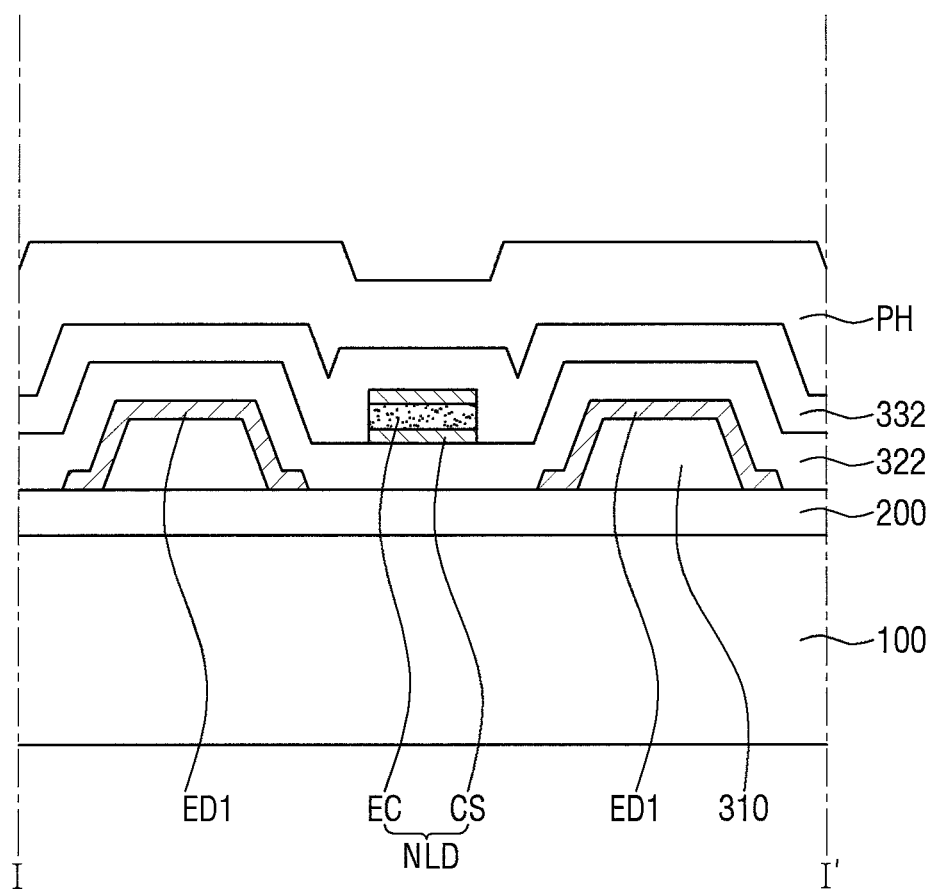

Next, referring to FIG. 10, a photosensitive material layer PH is applied onto the second passivation material layer 332.

Figure 11:
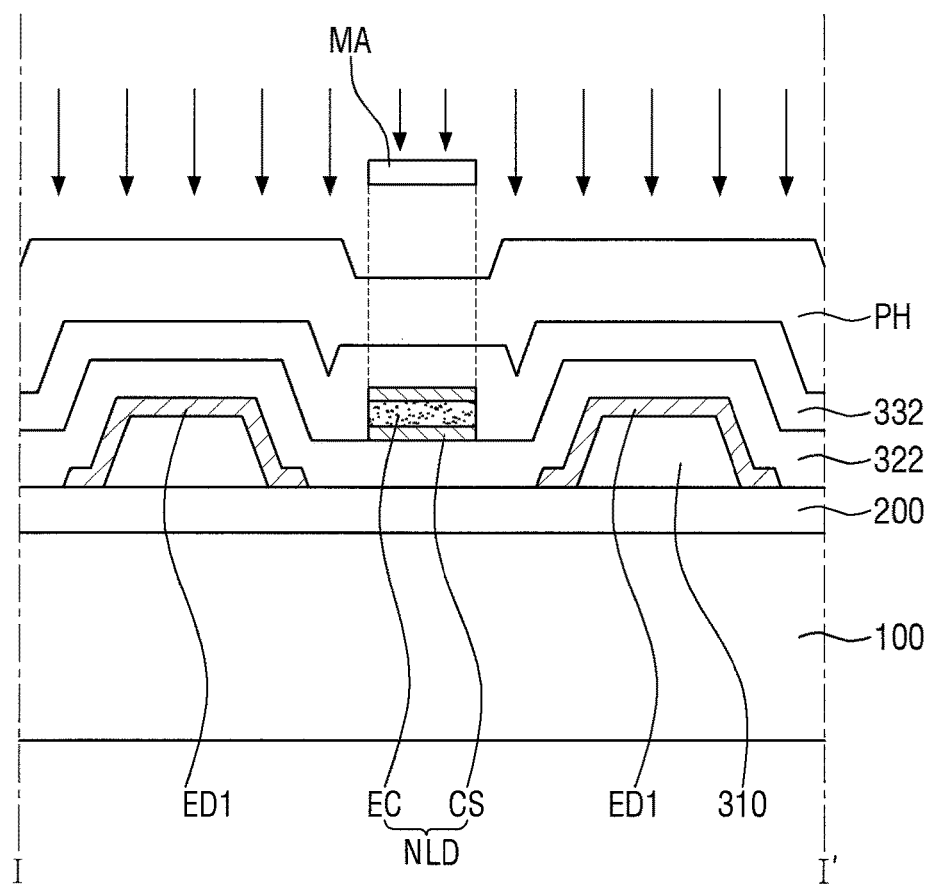

Next, referring to FIG. 11, ultraviolet light is irradiated to the photosensitive material layer PH by using a mask MA overlapping an area where each of the micro light emitting diodes NLD is disposed, that is, an area between the first diode electrode ED1 and the second diode electrode ED2. Here, the photosensitive material layer PH may contain a positive photosensitive material. However, the present inventive concept is not limited to this case, and the photosensitive material layer PH may also contain a negative photosensitive material. In examples utilizing the negative photosensitive material, a pattern formed in the mask MA may be reversed.

Figure 12:
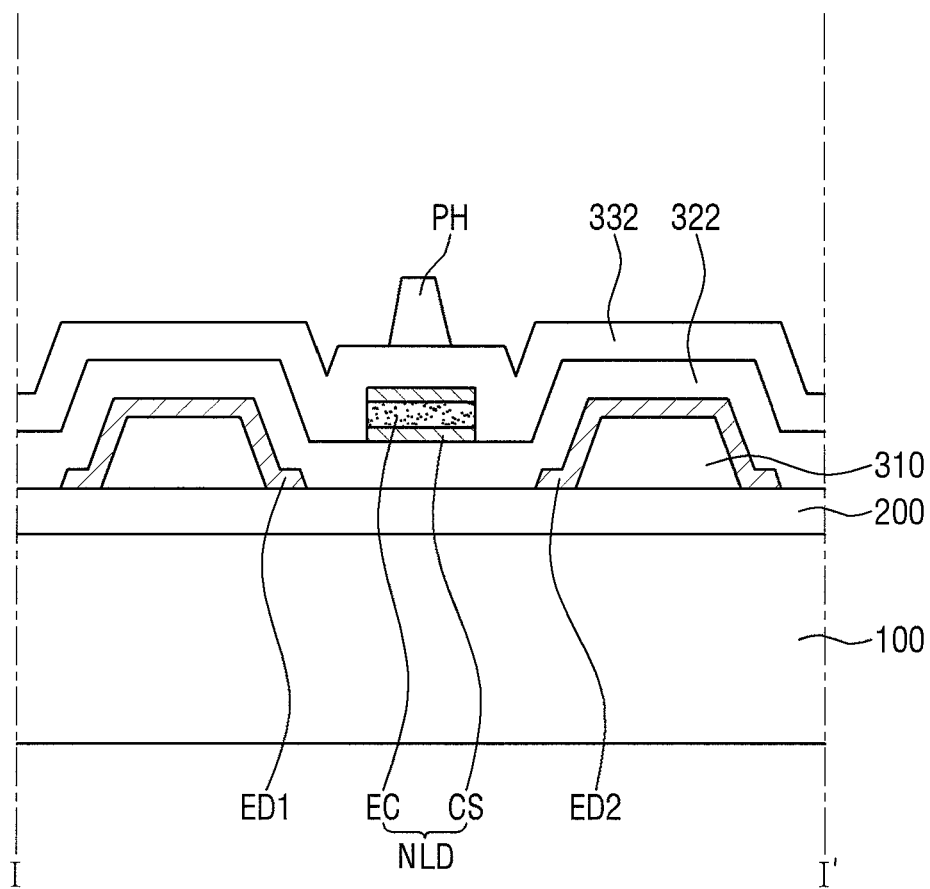

Next, referring to FIG. 12, areas of the photosensitive material layer PH, which are irradiated with the ultraviolet light, are removed.

Then, the first passivation material layer 322 and the second passivation material layer 332 are etched to correspond to the patterns of the photosensitive material layer PH and the micro light emitting diodes NLD. Here, the first passivation material layer 322 and the second passivation material layer 332 may be etched twice. If the first passivation material layer 322 and the second passivation material layer 332 are etched twice, a first or second sidewall SA1 or SA2 of each of the micro light emitting diodes NLD and each sidewall of a first passivation pattern 320 may be manufactured to form the same plane, as described above.

Figure 13:
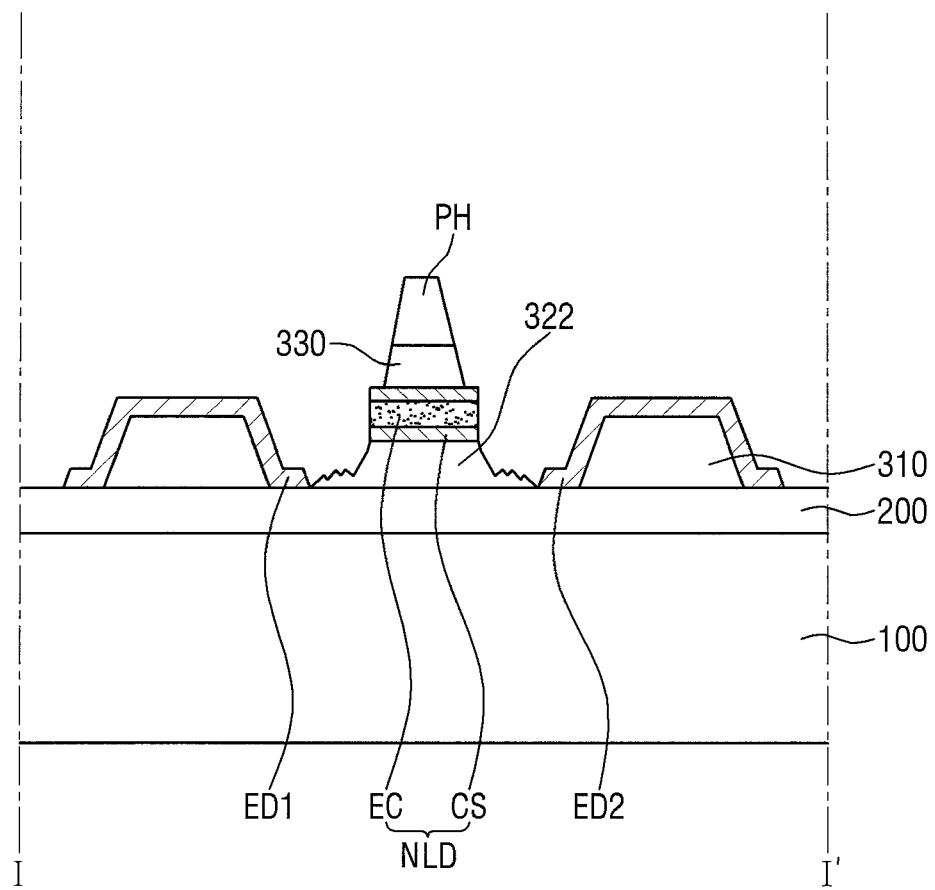

Specifically, referring to FIG. 13, the first passivation material layer 322 and the second passivation material layer 332 are etched for a first time. The first etching process may be relatively more anisotropic, may be performed for a longer time, and may etch a larger amount of material than a second etching process.

More specifically, the first etching process may be performed for a long time under the conditions of a pressure of about 5 [mT] to about 50 [mT] and a power of about 1 [KW] to about 3 [KW] by using a (hydro) fluorocarbon-based gas having a flow rate of about 10 [sccm] to about 100 [sccm] and an additive gas containing at least one of CF4, C4F8, CHF3, CH2F2, C2HF5, AR, and He and having a flow rate of about 10 [sccm] to about 100 [sccm].

The first etching process may be performed until the second passivation material layer 332 is roughly changed into the shape of the second passivation pattern 330 and until the first passivation material layer 322 overlaps each of the micro light emitting diodes NLD and only part of the first passivation material layer 322 remains in an area other than the area where each of the micro light emitting diodes NLD is disposed.

Figure 14:
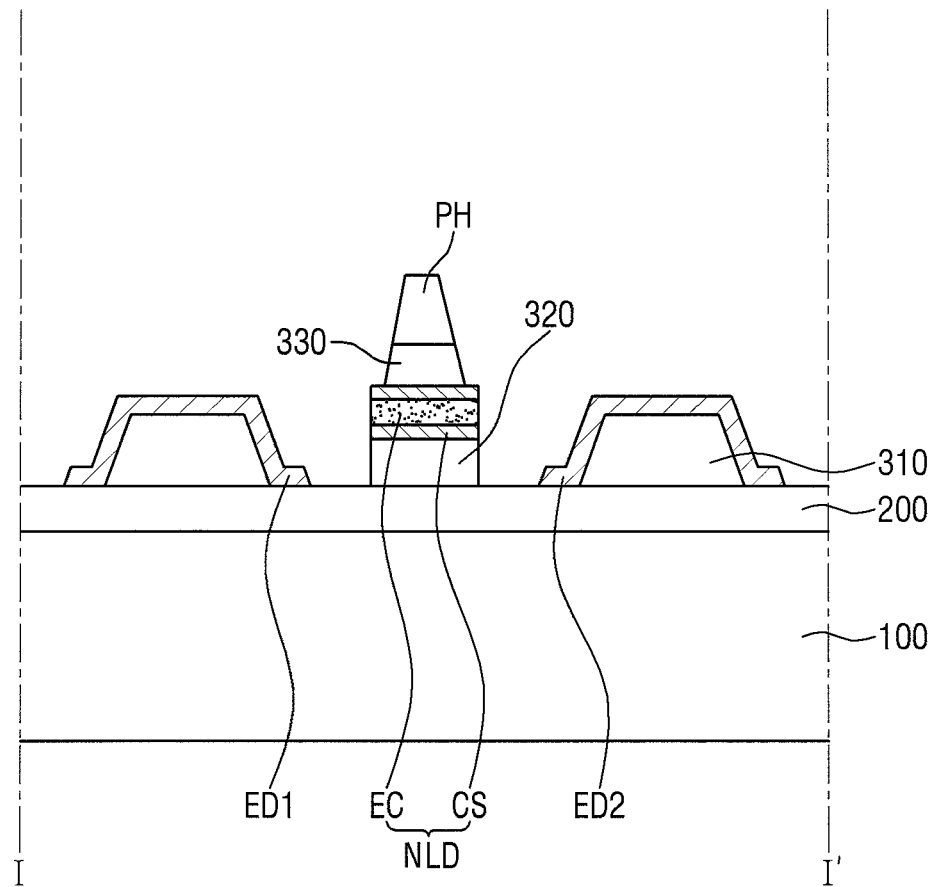

Next, referring to FIG. 14, the remaining first passivation material layer 322 and second passivation material layer 332 are etched for a second time. The second etching process may be relatively more isotropic, may be performed for a shorter time, and may etch a relatively smaller amount of material than the first etching process.

More specifically, the second etching process may be performed for a short time under the conditions of a pressure of about 5 [mT] to about 50 [mT] and a power of about 1 [KW] to about 3 [KW] by using a (hydro) fluorocarbon-based gas having a flow rate of about 10 [sccm] to about 150 [sccm] and an additive gas containing $O_2$ and at least one of CF4, C4F8, CHF3, CH2F2, C2HF5, and AR and having a flow rate of about 10 [sccm] to about 150 [sccm].

The second etching process completely changes the second passivation material layer 332 into the shape of the second passivation pattern 330 and removes part of the remaining first passivation material layer 322, so that the first sidewall SA1 or the second sidewall SA2 of each of the micro light emitting diodes NLD and each sidewall of the first passivation pattern 320 have the same plane.

Figure 15:
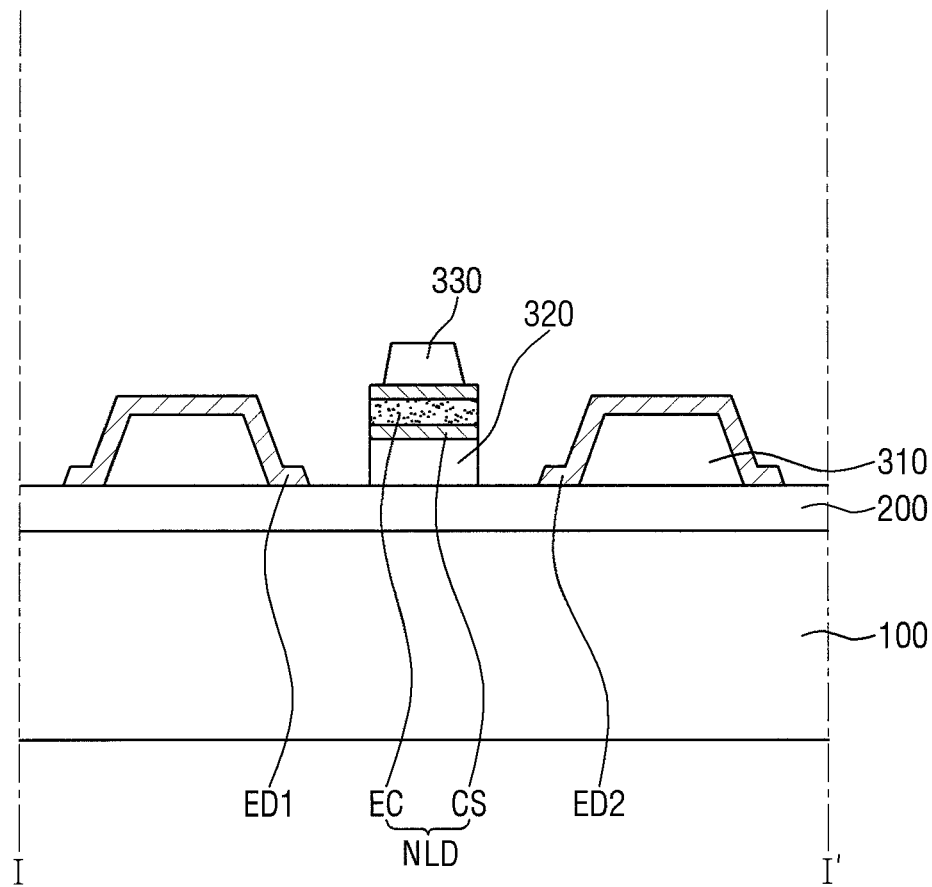

Next, referring to FIG. 15, the remaining photosensitive material layer PH is removed.

Through the processes of FIGS. 7 through 15, one mask process including two etching processes may be completed.

Figure 16:
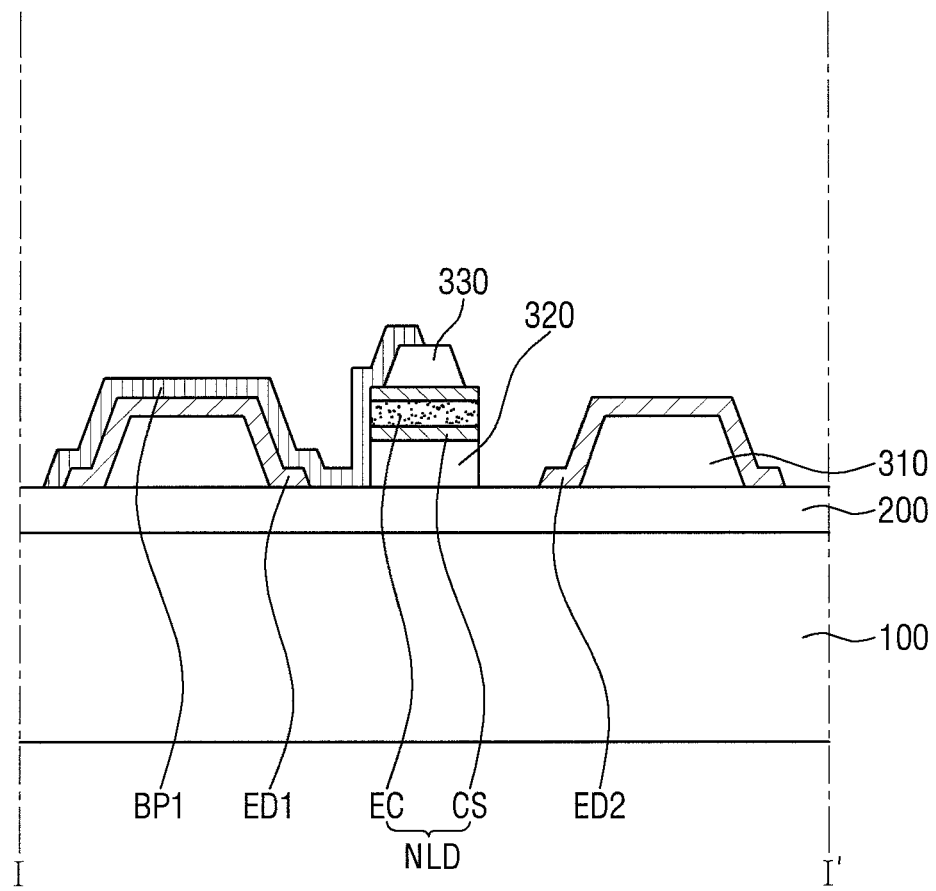

Next, referring to FIG. 16, a first bridge pattern BP1 is formed using one mask process.

Figure 17:
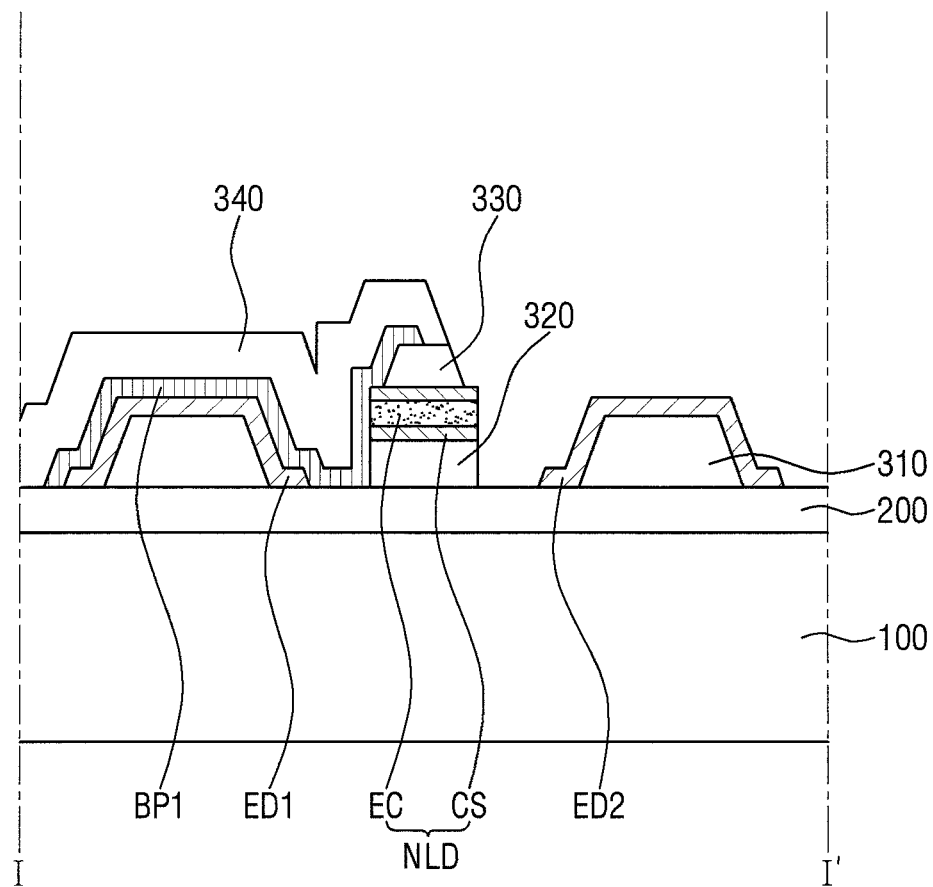

Next, referring to FIG. 17, a third passivation layer 340 is formed using one mask process.

Figure 18:
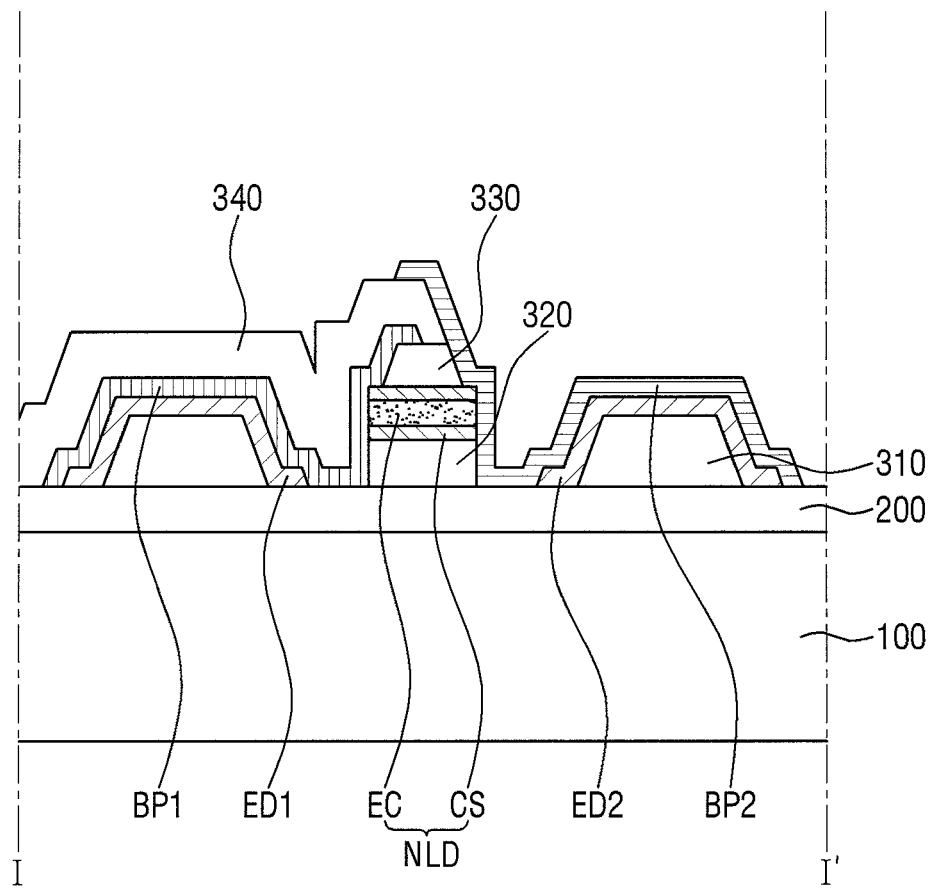

Next, referring to FIG. 18, a second bridge pattern BP2 is formed using one masking process. As a result, the manufacturing of a light emitting unit LU according to the embodiment of FIGS. 1 through 5 may be completed.

According to some embodiments, it is possible to provide a light emitting diode device having a reliable connection structure between a luminous body and an electrode connected to the luminous body.

Furthermore, it is possible to provide a method of manufacturing a light emitting diode device having a reliable connection structure between a luminous body and an electrode connected to the luminous body.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

While the present invention has been particularly illustrated and described with reference to exemplary embodiments thereof, it will be understood by those of ordinary skill in the art that various suitable changes in form and detail may be made therein without departing from the spirit and scope of the present invention as defined by the following claims and equivalents thereof.

What is claimed is:

1. A light emitting diode device comprising:
   a thin film transistor substrate comprising a plurality of light emitting areas;
   a first diode electrode and a second diode electrode on the thin film transistor substrate;
   a first passivation pattern between the first diode electrode and the second diode electrode;
   a plurality of micro light emitting diodes on the first passivation pattern;
   a first bridge pattern on the micro light emitting diodes and electrically connecting the first diode electrode to the micro light emitting diodes; and
   a second bridge pattern on the first bridge pattern and electrically connecting the second diode electrode to the micro light emitting diodes,
   wherein each sidewall of each of the micro light emitting diodes and each sidewall of the first passivation pattern form a same plane.

2. The light emitting diode device of claim 1, wherein each of the micro light emitting diodes comprises a light emitting material and a protective layer surrounding the light emitting material and having a cylindrical shape.

3. The light emitting diode device of claim 2, wherein each of the micro light emitting diodes has a cylindrical shape and comprises a first sidewall corresponding to a top surface and a second sidewall corresponding to a bottom surface.

4. The light emitting diode device of claim 3, wherein the light emitting material has a structure in which a p-type semiconductor layer, an intermediate layer, and an n-type semiconductor layer are sequentially arranged.

5. The light emitting diode device of claim 4, wherein the first sidewall exposes the p-type semiconductor layer, and the second sidewall exposes the n-type semiconductor layer.

6. The light emitting diode device of claim 5, wherein the first sidewall contacts the first bridge pattern, and the second sidewall contacts the second bridge pattern.

7. The light emitting diode device of claim 3, wherein the light emitting material has an inorganic crystal structure.

8. The light emitting diode device of claim 1, wherein the first bridge pattern extends along a sidewall of each of the micro light emitting diodes and a sidewall of the first passivation pattern.

9. The light emitting diode device of claim 8, wherein the second bridge pattern extends along a sidewall of each of the micro light emitting diodes and a sidewall of the first passivation pattern.

10. The light emitting diode device of claim 1, wherein the first diode electrode and the second diode electrode comprise fine electrode lines alternately arranged in parallel with each other.

11. The light emitting diode device of claim 10, wherein the first passivation pattern is between the fine electrode lines.

12. The light emitting diode device of claim 10, wherein the micro light emitting diodes is between the fine electrode lines.

13. The light emitting diode device of claim 1, further comprising barrier ribs on the thin film transistor substrate and under the first diode electrode and the second diode electrode.

* * * * *